United States Patent
Wen

(10) Patent No.: US 8,975,998 B2
(45) Date of Patent: Mar. 10, 2015

(54) PLANAR MAGNETIC COMPONENT AND METHOD FOR MANUFACTURING THE SAME

(71) Applicant: Shanghai Zhuo Kai Electronic Technology Co., Ltd, Shanghai (CN)

(72) Inventor: Yao-Long Wen, Chung-Li (TW)

(73) Assignee: Shanghai Zhuo Kai Electronic Technology Co., Ltd., Shanghai (CN)

( * ) Notice: Subject to any disclaimer, the term of this patent is extended or adjusted under 35 U.S.C. 154(b) by 0 days.

(21) Appl. No.: 14/093,738

(22) Filed: Dec. 2, 2013

(65) Prior Publication Data

US 2014/0085032 A1    Mar. 27, 2014

(30) Foreign Application Priority Data

Dec. 3, 2012    (CN) .......................... 2012 1 0511013

(51) Int. Cl.
| | |
|---|---|
| H01F 5/00 | (2006.01) |
| H01F 17/04 | (2006.01) |
| H01F 7/06 | (2006.01) |
| H01F 41/02 | (2006.01) |
| H01F 41/04 | (2006.01) |
| H05K 1/16 | (2006.01) |
| H01F 27/28 | (2006.01) |

(52) U.S. Cl.
CPC ................ *H01F 5/003* (2013.01); *H01F 41/02* (2013.01); *H01F 41/046* (2013.01); *H01F 2027/2809* (2013.01); *H05K 1/165* (2013.01); *H05K 2201/086* (2013.01); *H05K 2201/09672* (2013.01)
USPC ........................... 336/200; 336/221; 29/602.1

(58) Field of Classification Search
USPC .......... 336/200, 223, 232, 221; 29/602.1, 605, 29/606
See application file for complete search history.

(56) References Cited

U.S. PATENT DOCUMENTS

| | | | | |
|---|---|---|---|---|
| 5,191,699 | A * | 3/1993 | Ganslmeier et al. | 29/602.1 |
| 5,959,846 | A * | 9/1999 | Noguchi et al. | 361/782 |
| 6,148,500 | A * | 11/2000 | Krone et al. | 29/602.1 |
| 7,196,607 | B2 * | 3/2007 | Pleskach et al. | 336/200 |
| 8,203,418 | B2 | 6/2012 | Harrison et al. | |
| 2008/0017404 | A1 * | 1/2008 | Whittaker et al. | 174/255 |
| 2009/0309687 | A1 * | 12/2009 | Aleksov et al. | 336/200 |

* cited by examiner

*Primary Examiner* — Mangtin Lian
(74) *Attorney, Agent, or Firm* — WPAT, PC; Justin King

(57) ABSTRACT

A planar magnetic component and a method for manufacturing the same are provided. The planar magnetic component includes a substrate, a first conductor layer and a magnetic structure; wherein the first conductor layer is disposed on a first surface of the substrate, and the magnetic structure penetrates the first conductor layer and is embedded in the substrate. The magnetic structure includes a ferromagnetic material layer and at least one first hard protective layer disposed on a first surface of the ferromagnetic material layer, which could prevent the ferromagnetic material layer from breaking in a pressing process.

14 Claims, 4 Drawing Sheets

PLANAR MAGNETIC COMPONENT AND METHOD FOR MANUFACTURING THE SAME

FIELD OF THE INVENTION

The present invention relates to a magnetic component, and more particularly to a planar magnetic component having an embedded magnetic structure and adapted to be applied in a transformer.

BACKGROUND OF THE INVENTION

An embedded magnetic component of a traditional transformer suitable for being used in a communication connector is such as an iron core. Generally, the iron core has a main magnetic material of $Fe_3O_4$. In view of a breakable feature of the iron core, an embedded magnetic component surrounded with a flexible stuff is proposed. A elasticity material such as epoxy resin proposed in U.S. Pat. No. 8,203,418 B2 is used for cushioning a stress resulting from a thermal expansion and contraction in operating element and affecting on the magnetic component to reduce a possibility of breaking the magnetic component. However, the elasticity material such as epoxy resin cannot be used for preventing the iron core from breaking in a pressing process.

In view of the aforementioned reasons, there is a need to provide a new transformer structure having the embedded magnetic component to improve a capability for protecting the iron core and a yield for producing the transformer.

SUMMARY OF THE INVENTION

The present invention provides a planar magnetic component and a method for manufacturing the same to improve a production yield of a transformer.

In order to achieve the aforementioned advantages or other merits, a planar magnetic component including a substrate, a first conductor layer and a magnetic structure is provided in an embodiment of the present invention. The first conductor layer is disposed on a first surface of the substrate. The magnetic structure penetrates through the first conductor layer and embedded in the substrate. The magnetic structure includes a ferromagnetic material layer and at least one first hard protective layer disposed on a first surface of the ferromagnetic material layer.

In an embodiment of the present invention, the magnetic structure further includes a second hard protective layer disposed on a second surface of the ferromagnetic material layer, wherein the first surface of the ferromagnetic material layer and the second surface of the ferromagnetic material layer are opposite to each other.

In an embodiment of the present invention, the first hard protective layer and the second hard protective layer have a material of a reactive resin having an epoxy group.

In an embodiment of the present invention, the reactive resin having the epoxy group has a glass transition temperature greater than 200° C.

In an embodiment of the present invention, the reactive resin having the epoxy group has a coefficient of thermal expansion greater than or equal to that of the substrate.

In an embodiment of the present invention, the planar magnetic component further includes a second conductor layer disposed on a second surface of the substrate opposite to the first surface of the substrate and a third conductor layer disposed on a surface of the first conductor layer away from the first surface of the substrate as well as disposed on a surface of the magnetic structure away from the second surface of the substrate.

In an embodiment of the present invention, the first hard protective layer is disposed between the ferromagnetic material layer and the third conductor layer.

In an embodiment of the present invention, the planar magnetic component further includes a plurality of holes and at least one wire, wherein each of the hole penetrates through the third conductor layer, the magnetic structure, the substrate, and the second conductor layer, and the wire passes through the hole as well as entwines the magnetic structure.

In an embodiment of the present invention, the substrate is a printed circuit board.

The present invention further provides a method for manufacturing a planar magnetic component. The method includes steps of providing a substrate, wherein a first conductor layer is disposed on a first surface of the substrate; forming a recess in the substrate, wherein the recess penetrates through the first conductor layer; and forming a magnetic structure in the recess, wherein the magnetic structure includes a ferromagnetic material layer and at least one first hard protective layer disposed on a first surface of the ferromagnetic material layer.

In an embodiment of the present invention, the magnetic structure further includes a second hard protective layer disposed on a second surface of the ferromagnetic material layer, wherein the first surface of the ferromagnetic material layer and the second surface of the ferromagnetic material layer are opposite to each other.

In an embodiment of the present invention, the first hard protective layer and the second hard protective layer have a material of a reactive resin having an epoxy group.

In an embodiment of the present invention, a second conductor layer is formed on a second surface of the substrate, wherein the second surface of the substrate is opposite to the first surface of the substrate.

In an embodiment of the present invention, the method further includes forming a third conductor layer on a surface of the first conductor layer away from the first surface of the substrate as well as disposed on a surface of the magnetic structure away from the second surface of the substrate.

In an embodiment of the present invention, the first hard protective layer is disposed between the ferromagnetic material layer and the third conductor layer.

In an embodiment of the present invention, the method further includes forming a plurality of holes, wherein each of the hole penetrates through the third conductor layer, the magnetic structure, the substrate, and the second conductor layer, and then at least one wire passes through the hole as well as entwines the magnetic structure.

In summary, two hard protective layers respectively disposed on an upper surface and a lower surface of the ferromagnetic material layer is provided to protect and prevent the ferromagnetic material layer from being breaking in a pressing process. Furthermore, the magnetic structure embedded in the substrate having a conductor layer on a first surface of the substrate is also provided to enhance a bonding strength between the substrate and other conductor layers subsequently formed over the first surface of the substrate without forming additional adhesive layers therebetween.

For making the above and other purposes, features and benefits become more readily apparent to those ordinarily skilled in the art, the preferred embodiments and the detailed descriptions with accompanying drawings will be put forward in the following descriptions.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

FIGS. 1A~1E are schemes illustrating a method for manufacturing a planar magnetic component in accordance with an embodiment of the present invention. Please refer to FIG. 1A and FIG. 1B. The method for manufacturing the planar magnetic component includes steps of: providing a substrate 110, wherein the a first conductor layer 111 is formed on a first surface S1 of the substrate 110, a second conductor layer 112 is formed on a second surface S2 of the substrate 110, and the first surface S1 of the substrate 110 is opposite to the second surface S2 of the substrate 110 (shown in FIG. 1A); forming a recess H1 in the substrate 110, wherein the recess H1 penetrates through the first conductor layer 110 (shown in FIG. 1B). Furthermore, the substrate is, for example, a printed circuit board (PCB). The first conductor layer 111 and the second conductor layer 112 have a material such as copper.

Figure 1A:
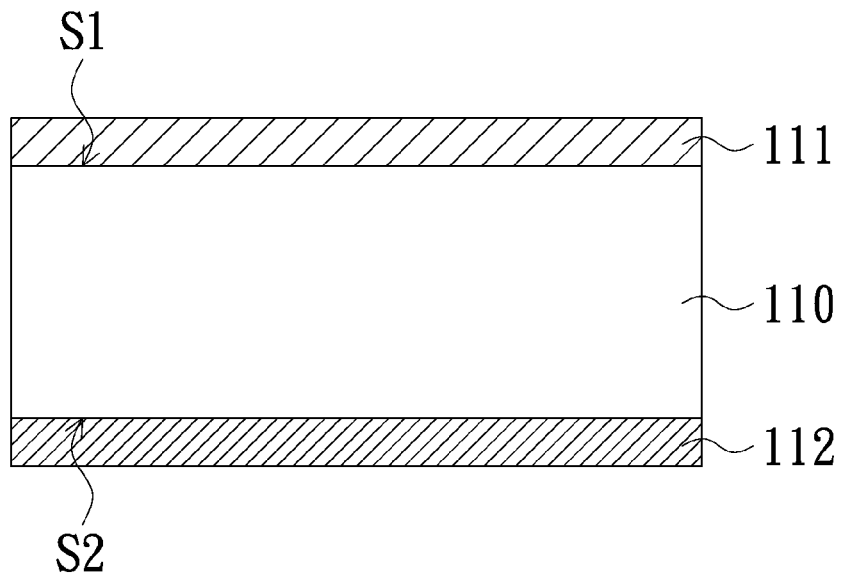
FIGS. 1A~1E are schemes illustrating a method for manufacturing a planar magnetic component in accordance with an embodiment of the present invention.
Figure 1B:
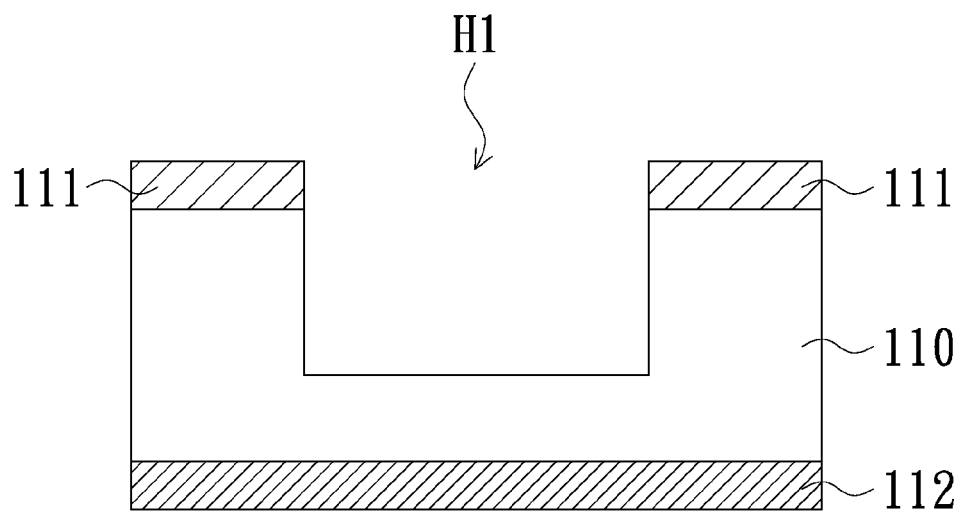
Figure 1C:
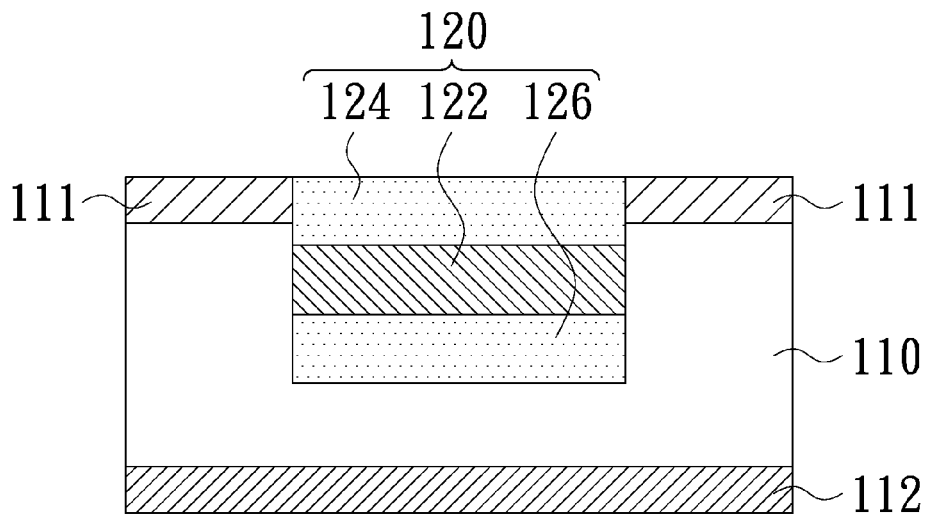

Please refer to FIG. 1C. After forming the recess H1 in the substrate 110, the method further includes forming a magnetic structure 120 in the recess H1, so the magnetic structure 120 could be embedded in the substrate 110. The magnetic structure 120 includes a ferromagnetic material layer 122 and at least one first hard protective layer 124 disposed on a first surface of the ferromagnetic material layer 122. The ferromagnetic material layer 122 is an iron core for example. The magnetic structure 120 further includes such as a second hard protective layer 126 disposed on a second surface of the ferromagnetic material layer 122, wherein the second surface of the ferromagnetic material layer 122 and the first surface of the ferromagnetic material layer 122 are opposite to each other. In other words, the first hard protective layer 124 and the second hard protective layer 126 are respectively disposed on an upper surface of the ferromagnetic material layer 122 and a lower surface of the ferromagnetic material layer 122. So the first hard protective layer 124 and the second hard protective layer 126 could protect and prevent the ferromagnetic material layer 122 from breaking in a pressing process. Therefore, the first hard protective layer 124 and the second hard protective layer 126 have a material of a fully hardened reactive resin having a epoxy group, wherein the reactive resin having the epoxy group has a glass transition temperature (Tg) greater than 200° C., and has a coefficient of thermal expansion (CTE) greater than or equal to that of the substrate 110.

Therefore, the step of forming the magnetic structure 120 includes steps of forming firstly the second hard protective layer 126 formed by forming the reactive resin having the epoxy group on a bottom of the recess H1; forming the ferromagnetic material layer 122 on the second hard protective layer 126; and then forming the first hard protective layer 124 formed by forming the reactive resin having the epoxy group on the ferromagnetic material layer 122, and the magnetic structure 120 is completed.

Figure 1D:
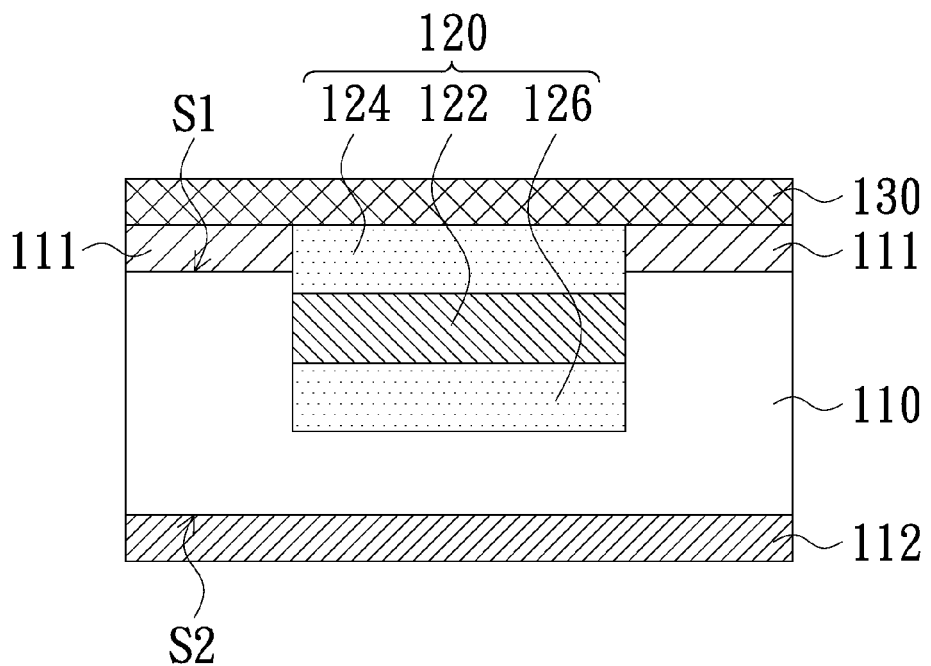

Please refer to FIG. 1D. After forming the magnetic structure 120, the method for manufacturing the planar magnetic component further includes a step of forming a third conductor layer 130 on a surface of the first conductor layer 111 away from the first surface S1 as well as on a surface of the magnetic structure 120 away from the second surface S2 of the substrate 110. The first hard protective layer 124 is, for example, disposed between the ferromagnetic material layer 122 and the third conductor layer 130, wherein the third conductor layer 130 partly contacts with the first hard protective layer 124. The third conductor layer 130 has a material of such as copper. It is worth mentioning that the first conductor layer 111 is partly retained on the substrate 110, and the third conductor layer 130 having the same material with the first conductor layer 111 partly directly contacts with the first conductor layer 111, so a bonding strength between the substrate 110 and other conductor layer (such as third conductor layer) subsequently formed over the substrate 110 could be enhanced and the third conductor layer 130 could directly disposed on the first conductor layer 111 without forming an additional adhesive layer between the first conductor layer 111 and the third conductor layer 130.

Figure 1E:
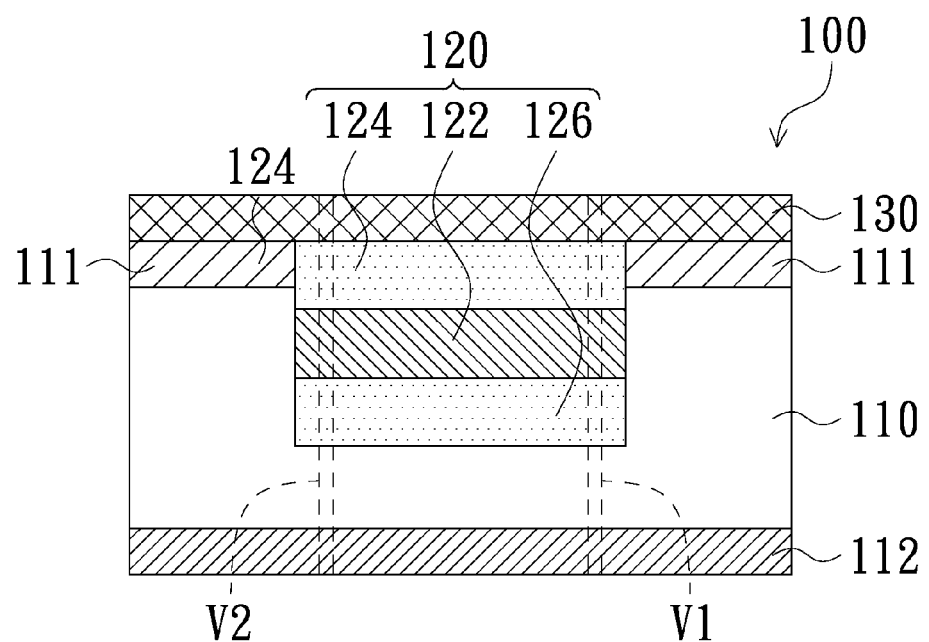
Figure 1F:
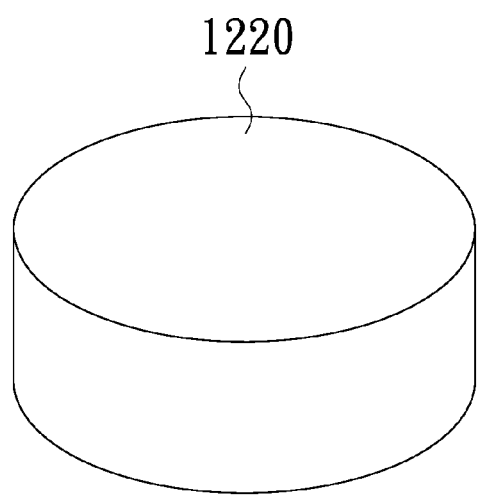
FIGS. 1F~1G are schematic diagrams illustrating shapes of a ferromagnetic material layer.
Figure 1G:
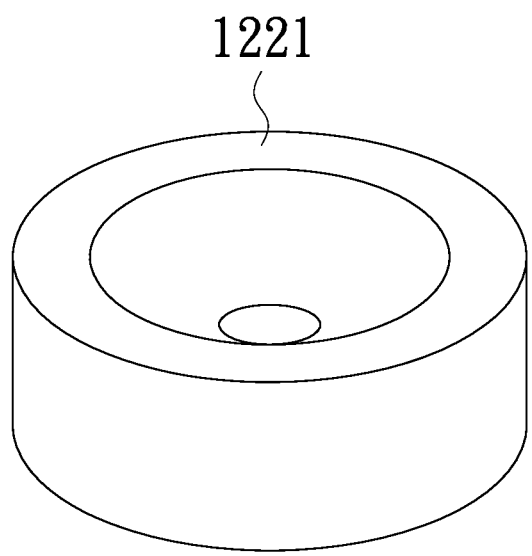

Next, please refer to FIG. 1E. After forming the third conductor layer 130, the method for manufacturing the planar magnetic component further includes a step of forming a plurality of holes. As illustrated in FIG. 1E, it is understood that a plurality of holes in this embodiment is exemplified by including two holes V1, V2 and the present invention is not limited thereto. The holes V1, V2 penetrate through the third conductor layer 130, the magnetic structure 120, the substrate 110 and the second conductor layer 112, and then at least one wire (not shown in FIG. 1E) passes through the holes V1, V2 as well as entwines the magnetic structure 120 more than one rounds, and then the planar magnetic component 100 with the above-mentioned winding structure is completed. Please refer to FIGS. 1F, 1G. The ferromagnetic material layer 122 is such as a solid cylinder 1220 or has a tube-shape 1221, and a shape of the recess H1 could be adjusted in accordance with the shape of the ferromagnetic material layer and the present invention is not limited to that shown in the figures. It is worth mentioning that if the ferromagnetic material layer 122 is a solid cylinder, and then such as a insulating layer is disposed around a side wall of the holes V1, V2 (not shown in figures). So the wire passing through the holes V1, V2 could be isolated from the magnetic structure 120 by the insulating layer.

In addition, the planar magnetic component 100 is not only adapted to be applied in producing a broadband planar transformer used in a communication connector, but also applied in producing a device used in non-Ethernet applications including applied in a set-top box, a RF router, a RF mobile device, and a consumer electronics product.

In summary, two hard protective layers respectively disposed on an upper surface and a lower surface of the ferromagnetic material layer is provided to protect and prevent the ferromagnetic material layer from being breaking in a pressing process. Furthermore, the magnetic structure embedded in the substrate having a conductor layer on a first surface of the substrate is also provided to enhance a bonding strength between the substrate and other conductor layers subsequently formed over the first surface of the substrate without forming additional adhesive layers therebetween.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A planar magnetic component, comprising:
   a substrate;
   a first conductor layer disposed on a first surface of the substrate;
   a magnetic structure penetrating through the first conductor layer and embedded in the substrate, the magnetic structure including:
      a ferromagnetic material layer; and
      at least one first hard protective layer disposed on a first surface of the ferromagnetic material layer;
   a second conductor layer disposed on a second surface of the substrate opposite to the first surface of the substrate; and
   a third conductor layer disposed on a surface of the first conductor layer away from the first surface of the substrate as well as disposed on a surface of the magnetic structure away from the second surface of the substrate;
   wherein the first hard protective layer is disposed between the ferromagnetic material layer and the third conductor layer, and the third conductor layer has the same material with the first conductor layer and partly directly contacts with the first conductor layer.

2. The planar magnetic component according to claim 1, wherein the magnetic structure further includes a second hard protective layer disposed on a second surface of the ferromagnetic material layer, wherein the first surface of the ferromagnetic material layer and the second surface of the ferromagnetic material layer are opposite to each other.

3. The planar magnetic component according to claim 2, wherein the first hard protective layer and the second hard protective layer have a material of a reactive resin having an epoxy group.

4. The planar magnetic component according to claim 3, wherein the reactive resin having the epoxy group has a glass transition temperature greater than 200° C.

5. The planar magnetic component according to claim 3, wherein the reactive resin having the epoxy group has a coefficient of thermal expansion greater than or equal to that of the substrate.

6. The planar magnetic component according to claim 1, further comprising a plurality of holes and at least one wire, wherein each of the hole penetrates through the third conductor layer, the magnetic structure, the substrate, and the second conductor layer, and the wire passes through the hole as well as entwines the magnetic structure.

7. The planar magnetic component according to claim 1, wherein the substrate is a printed circuit board.

8. A method for manufacturing a planar magnetic component:
   providing a substrate, wherein a first conductor layer is disposed on a first surface of the substrate;
   forming a recess in the substrate, wherein the recess penetrates through the first conductor layer;
   forming a magnetic structure in the recess, wherein the magnetic structure includes a ferromagnetic material layer and at least one first hard protective layer disposed on a first surface of the ferromagnetic material layer;
   forming a second conductor layer on a second surface of the substrate, wherein the second surface of the substrate is opposite to the first surface of the substrate; and
   forming a third conductor layer on a surface of the first conductor layer away from the first surface of the substrate as well as disposed on a surface of the magnetic structure away from the second surface of the substrate;
   wherein the first hard protective layer is disposed between the ferromagnetic material layer and the third conductor layer, and the third conductor layer has the same material with the first conductor layer and partly directly contacts with the first conductor layer.

9. The method for manufacturing a planar magnetic component according to claim 8, wherein the magnetic structure further includes a second hard protective layer disposed on a second surface of the ferromagnetic material layer, wherein the first surface of the ferromagnetic material layer and the second surface of the ferromagnetic material layer are opposite to each other.

10. The method for manufacturing a planar magnetic component according to claim 9, wherein the first hard protective layer and the second hard protective layer have a material of a reactive resin having an epoxy group.

11. The method for manufacturing a planar magnetic component according to claim 10, wherein the reactive resin having the epoxy group has a glass transition temperature greater than 200° C.

12. The method for manufacturing a planar magnetic component according to claim 10, the reactive resin having the epoxy group has a coefficient of thermal expansion greater than or equal to that of the substrate.

13. The method for manufacturing a planar magnetic component according to claim 8, further comprising forming a plurality of holes, wherein each of the hole penetrates through the third conductor layer, the magnetic structure, the substrate, and the second conductor layer, and then at least one wire passes through the hole as well as entwines the magnetic structure.

14. The method for manufacturing a planar magnetic component according to claim 8, wherein the substrate is a printed circuit board.

* * * * *